United States Patent
Fulford et al.

[11] Patent Number: 6,136,616
[45] Date of Patent: *Oct. 24, 2000

[54] METHOD OF FORMING SEMICONDUCTOR DEVICES USING GATE ELECTRODE DIMENSIONS AND DOPANT CONCENTRATION FOR CONTROLLING DRIVE CURRENT STRENGTH

[75] Inventors: H. Jim Fulford; Anthony J. Toprac; Randy Blair, all of Austin, Tex.

[73] Assignee: Advanced Micro Devices, Sunnyvale, Calif.

[ * ] Notice: This patent is subject to a terminal disclaimer.

[21] Appl. No.: 09/022,129

[22] Filed: Feb. 11, 1998

[51] Int. Cl.⁷ .......................... G01R 31/26; H01L 21/66
[52] U.S. Cl. .......................... 438/14; 438/301; 438/303; 438/305
[58] Field of Search .................. 438/14, 301, 303, 438/305, FOR 185, FOR 174, 289, 291, 194, 514

[56] References Cited

U.S. PATENT DOCUMENTS

| | | | |
|---|---|---|---|
| 4,648,175 | 3/1987 | Metz, Jr. et al. | 29/589 |
| 4,868,617 | 9/1989 | Chiao et al. | 257/344 |
| 5,834,795 | 11/1998 | Lee | 257/48 |
| 5,923,982 | 7/1999 | Kadosh et al. | 438/286 |

FOREIGN PATENT DOCUMENTS 358197878  11/1983  Japan .

OTHER PUBLICATIONS

Campbell, Stephen A., "The Science and Engineering of Microelectronic Fabrication," 1996, pp. 6–7.
English translation of JP358197878 by Takeuchi et al.

*Primary Examiner*—Carl Whitehead, Jr.
*Assistant Examiner*—Jamie L. Davis

[57] ABSTRACT

A semiconductor device having a controlled drive current strength is produced by varying dopant concentration to accommodate any variation in channel length, which is affected by variations in gate electrode dimension(s) from a desired value. After formation of the gate electrode on a substrate, its dimension(s) is measured and compared to a desired value. Based on any differences between the measured and desired values, the concentration of dopant implanted into the substrate is determined in order to counteract the variation in gate electrode dimension. This results in a change in dopant concentration that counteracts the effect of the variation in gate electrode dimension on the drive current strength. The present process provides enhanced control over the drive current strength of semiconductor devices and provides decreased variation within and between lots and corresponding increases in productivity.

8 Claims, 2 Drawing Sheets

METHOD OF FORMING SEMICONDUCTOR DEVICES USING GATE ELECTRODE DIMENSIONS AND DOPANT CONCENTRATION FOR CONTROLLING DRIVE CURRENT STRENGTH

FIELD OF THE INVENTION

The present invention is generally directed to the manufacture of semiconductor devices. More particularly, the invention is directed to the manufacture of semiconductor devices in which the drive current strength of transistors can be controlled using gate electrode dimensions and dopant concentration.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicabilities and numerous disciplines. An example of such a silicon-based semiconductor device is a metal-oxide-semiconductor (MOS) transistor. The principle elements of a typical MOS semiconductor device are illustrated in FIG. 1. The device generally includes a gate electrode 101, which acts as a conductor, to which an input signal typically is applied via a gate terminal (not shown). Heavily doped source region 103 and drain region 105 are formed in a semiconductor substrate 107, and respectively are connected to source and drain terminals (not shown).

A channel region 109 is formed in the semiconductor substrate 107 beneath the gate electrode 101 and separates the source region 103 and drain region 105. The channel typically is lightly doped with a dopant of a type opposite to that of the source and drain regions. The gate electrode 101 is physically separated from the semiconductor substrate 107 by a gate insulating layer 111. Typically, this insulating layer is an oxide layer such as $SiO_2$. The insulating layer 111 is provided to prevent current from flowing between the gate electrode 101 and the semiconductor source region 103, drain region 105 or channel region 109.

In operation, an output voltage typically is developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner, an electric field controls the current flow through the channel region 109. This type of device commonly is referred to as a MOS field-effect transistor (MOSFET). Semiconductor devices such as the one described are used in large numbers to construct most modern electronic devices. In order to increase the capability of such electronic devices, it is necessary to integrate ever larger numbers of such devices into a single silicon wafer. As the semiconductor devices are scaled down in order to form a larger number of such devices on a given surface area, the structure of the devices and the fabrication techniques used to make the devices must be altered.

One important property of MOS devices is drive current strength. It is particularly important to provide semiconductor devices that exhibit the designed drive current strength and also to maintain a substantially constant drive current strength between production lots and within a single production lot.

The drive current strength is inversely proportional to channel length, which is dependent on gate electrode dimensions. As the dimensions of semiconductor devices become smaller and smaller, production variations in gate electrode dimensions have an increased significance with respect to variation in drive current strength.

SUMMARY OF THE INVENTION

Generally, the present invention relates to a method of producing a semiconductor device with controlled drive current strength. Consistent with the present invention, a semiconductor device is formed by forming a gate electrode over a substrate. The dimensions of the gate electrode are measured and compared to desired design values. The concentration of dopant in a subsequent dopant implanting operation is determined, based on the difference between the measured and designed values of the gate electrode. Thus, the concentration of dopant can be varied to take into account the variation in electrode dimensions from the desired values. This allows the drive current strength of the final semiconductor device to be controlled and also permits variations within and between lots of the semiconductor devices to be reduced.

The above summary of the present invention is not intended to describe each illustrated embodiment or every implementation of the present invention. The figures and detailed description that follow describe the embodiments more particularly.

BRIEF DESCRIPTION OF THE DRAWINGS

The present invention may be understood more completely in consideration of the following detailed description of the various embodiments of the invention in connection with the accompanying drawings, in which.

Figure 1:
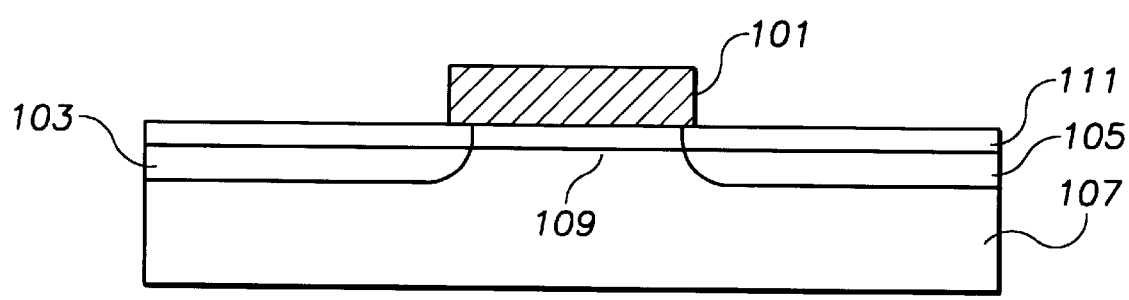
FIG. 1 illustrates the components of a typical MOS semiconductor device.

The invention is amenable to various modifications and alternative forms, and the specifics of the present invention have been shown only by way of example in the drawings, and will be described in detail. It should be understood that the intention is not to limit the invention to the particular embodiments described. On the contrary, the intention is to cover all modifications, equivalents and alternatives following the spirit and the scope of the invention as defined by the appended claims.

DETAILED DESCRIPTION OF THE VARIOUS EMBODIMENTS

The present invention is applicable to a variety of semiconductor devices, for example MOS devices such as an NMOS, PMOS, CMOS or BiCMOS device. While the present invention is not so limited, an understanding of the various aspects of the invention is best gained through a discussion of various application examples of the processes used to form the devices.

The present invention utilizes the relationship between channel length (which in turn can be controlled by the gate electrode dimensions) and dopant concentration and drive current strength to control the drive current strength of devices. This, for example, allows the fabrication of semiconductor devices having transistors with substantially constant drive strengths.

The drive current strength that is controlled may, for example be the source-drain current, the effective drive current or the off-state drive current, or any combination of these. The effective drive current Ideff of a transistor may, for example, be determined using well-known techniques, such as measuring the source-drain current of the transistor while applying a known voltage to the gate and the drain, and grounding the source of the transistor, and dividing the source-drain current by the transistor width. The transistor width may, for example, be the length of the polysilicon gate electrode over its respective active area. The off-state current Idoff of a transistor may, for example, be determined using well-known techniques, such as measuring the source-drain current of the transistor while applying a known voltage to the drain of the transistor and grounding the gate and source of the transistor.

Figure 2:
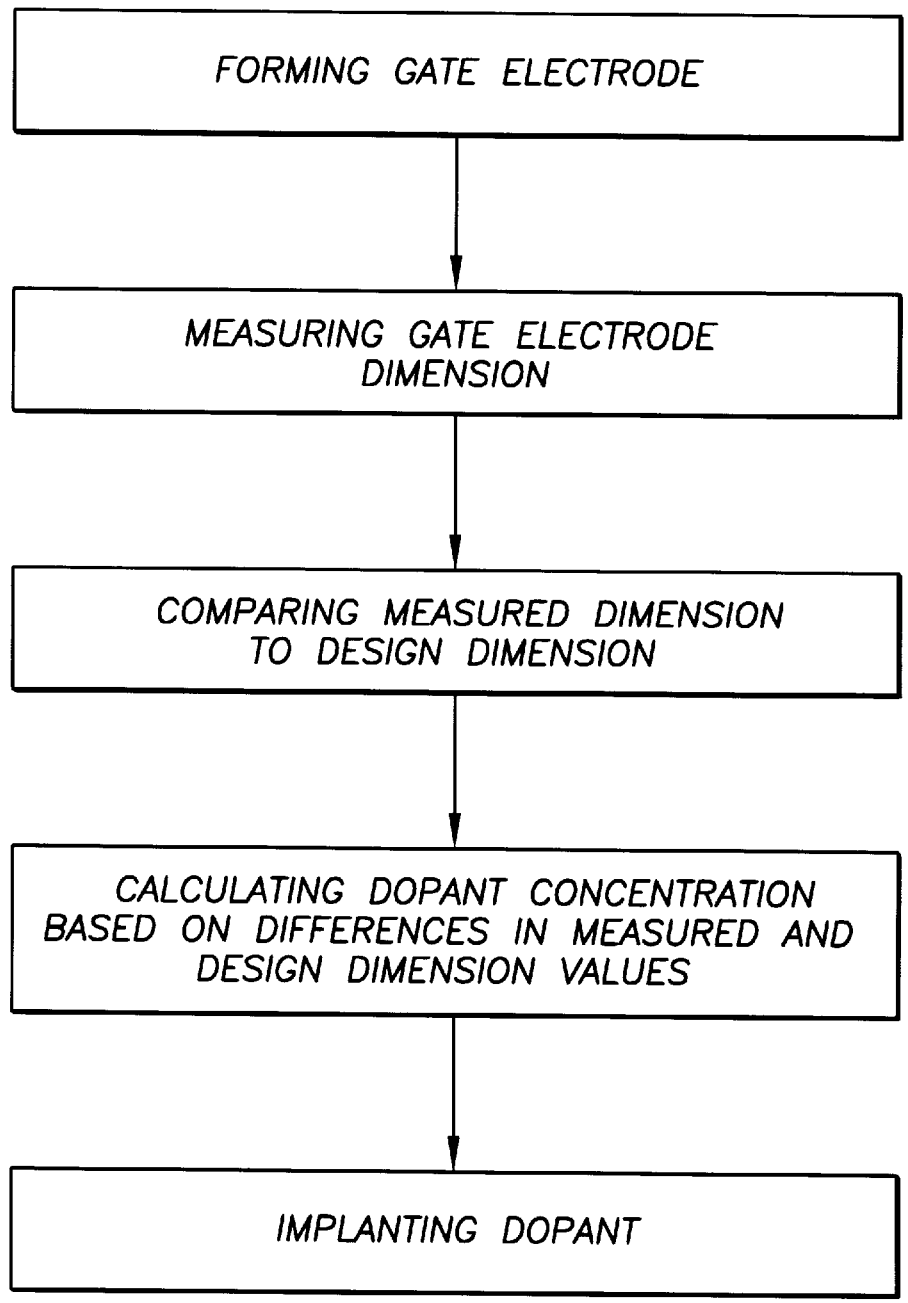
FIG. 2 shows a flow chart for a fabrication process in accordance with an exemplary embodiment of the present invention.

Referring to FIG. 2, the present process for manufacturing a semiconductor device forms one or more gate electrodes on a substrate. The gate electrodes typically will be formed on a gate insulating layer that can be formed by well-known deposition or growth techniques. The gate insulating layer can be made of any suitable known material. Examples include oxide and nitride materials such as silicon oxide and silicon nitride.

The gate electrodes can be formed of any suitable material, including, for example, polysilicon. The gate electrodes may, for example, be formed by depositing a gate electrode layer and selectively removing portions of the gate electrode layer to form the gate electrode. This can be done, for example, using well-known deposition and photolithography techniques. For example, the gate electrode can be formed by depositing a layer of gate electrode material over a gate insulating layer that has been formed on a substrate, followed by selectively removing portions of the gate electrode layer to leave the gate electrode. The gate electrode may be processed using known techniques, for example a photolithographic technique in which a layer of photoresist is formed over the gate electrode layer, followed by patterning and removal of part of the photoresist layer, followed by etching of the exposed portions of the gate electrode layer.

After the gate electrode has been formed, its dimensions are measured, particularly the length. For the purposes of this application, the "length" of the gate electrode will be considered to define the dimension of the gate electrode in the direction parallel to the length of the channel. The measurement can be carried out, for example, with a scanning electron microscope. The measurement could be carried out in situ after formation of the gate electrode or the substrate could be transferred to a separate station for measurement if desired. A measurement can be carried out at one or more locations on a given substrate as needed. The measurement can be carried out on a single substrate as representative of all of the substrates being processed as part of a given batch. Alternatively, some or all of the substrates in a given batch can be measured if desired.

In some cases, a spacer may be formed on the gate electrode. The measurement can be carried out before and/or after spacer formation as needed, depending on the specific dopant implanting scheme. The spacer can be formed in any well-known manner, depending on the specific application, and can be formed of any suitable material, for example oxide or nitride. Multiple spacer formation steps can be carried out if desired, and the measurement of gate electrode dimensions can be carried out before and/or after each as needed.

The measured value(s) of the gate electrode dimension(s) is compared to the design specification values. The dopant implanting dose then is chosen in view of any variation between the design and measured values in order to provide the desired drive current strength. For example, if the gate electrode dimension, e.g. length, is too large, the implanting dose will be increased. If the gate electrode dimension is too small, the implanting dose will be decreased.

The variation in drive current strength due to variation in gate electrode dimension is predictable for a given type of semiconductor device, and can easily be determined experimentally by measuring the drive current strengths for several devices having varying gate electrode dimensions. Similarly, the variation in drive current strength due to variation in dopant concentration is predictable for a given type of semiconductor device and can easily be determined experimentally by measuring the drive current strengths for several devices having varying dopant concentrations. While there may be some variation in these relationships for semiconductor devices of the same type from different sources, the relationships will be generally the same and the variations typically will be within 20–30%.

In a typical case where the gate electrode length is on the order of 0.35 $\mu$m, the gate electrode length is formed to a tolerance of about 15 nm using current techniques. A typical variation of drive current strength for a 1 nm variation in gate electrode length will be about 2 $\mu a/\mu m$ for an NMOS device and about 1.2 $\mu a/\mu m$ for a PMOS device. By way of example, using arsenic as the N-LDD dopant, a 33% increase in the implanting dose results in an increase in N Ideff of about 10 $\mu a/\mu m$, while a 66% increase in the dose results in an increase in N Ideff of about 20 $\mu a/\mu m$. Also by way of example, using $BF_2$ as the P-LDD dopant, an 8% increase in the implanting dose results in an increase in P Ideff of about 10 $\mu a/\mu m$, while a 16% increase in the dose results in an increase in P Ideff of about 20 $\mu a/\mu m$. An example of a typical drive current strength (Ideff in this case) is about 630 $\mu a/\mu m$ for an NMOS and about 310 $\mu a/\mu m$ for a PMOS.

The present invention can be used in for determining the dopant implanting concentration for any desired doping scheme. This includes both LDD (i.e. relatively low density implanting to form lightly-doped regions in the substrate) and source-drain implanting (i.e. relatively high density implanting to form heavily-doped regions in the substrate) for both NMOS and PMOS applications. By way of example, N-LDD dopant implanting may be carried out in a range of about 0.5E13–5E14 atoms/cm$^2$ for arsenic, N source-drain implanting in a range of about 0.8E14–8E15 atoms/cm$^2$ for arsenic, PLDD implanting in a range of about 0.5E14–4E15 atoms/cm$^2$ for $BF_2$ and P source-drain implanting in a range of about 1E15–7E15 atoms/cm for $BF_2$. The present invention is particularly advantageous for the LDD doping, since the LDD doping areas are closest to the edges of the gate electrode, although the present invention can be used in conjunction with any doping scheme as discussed above. As one example of the present invention, the gate electrode could be measured before carrying out LDD implanting. As a further option, this could be followed by spacer formation, which could be followed by an additional measurement before carrying out further implanting.

To further examplify the variations in dopant implanting with gate electrode dimension, assume that product specifications call for a gate electrode length of 0.290 $\mu$m and a target N Ideff of 610 $\mu a/\mu m$, with the target N-LDD dose of arsenic being 2.0e14. If the measured gate electrode dimension is 0.270 $\mu$m, the N implanting dose could be decreased to 2.3e13 in order to maintain the desired N Ideff. Similarly, implanting doses of 4.55e13, 6.8e13, 1.34e14, 2.66e14, 3.32e14, 4.41e14 and 5.5e14 could be used to accomodate measured gate electrode dimensions of 0.275 μm, 0.280 μm, 0.285 μm. 0.295 μm, 0.300 μm, 0.305 μm and 0.310 μm respectively. Assume again by way of example that the product specifications call for a gate electrode length of 0.290 μm and a target P Ideff of 310 μa/μm, with the target P-LDD dose for $BF_2$ being 1.5e14. If the measured gate electrode dimension is 0.270 μm, the P implanting dose could be decreased to 1.2e14 in order to maintain the desired N Ideff. Similarly, P implanting doses of 1.28e14, 1.35e14, 1.43e14, 1.58e14, 1.65e14, 1.73e14 and 1.80e14 could be used to accomodate measured gate electrode dimensions of 0.275 μm, 0.280 μm, 0.285 μm. 0.295 μm, 0.300 μm, 0.305 μm and 0.310 μm respectively.

After the dopant implanting has been completed, further processing to complete the semiconductor device can be carried out. This can include, for example, various annealing steps. The process of the present invention can be carried out using any suitable equipment. The process is suitable for automated control. For example, the measured dimension(s) of the gate insulating layer can be input to a control system that determines the difference between the measured and desired values, and controls the dopant concentration accordingly.

The process of the present invention is adaptable for a variety of process flows. For example, in the case of a CMOS device, the NMOS and PMOS devices could be formed separately. That is, the PMOS regions would be protected during the NMOS implanting and vice versa. The formation of the electrodes for the different devices could involve the formation of different gate insulating layers, if desired.

As noted above, the present invention is applicable to the fabrication of a variety of different devices where the advantages of controlled drive current strength are desired. Accordingly, the present invention is not limited to the particular examples described above, but rather should be understood to cover all aspects of the invention as fairly set forth in the attached claims. Various modifications, equivalent process and other structures to which the present invention may be applicable will be readily apparent to those of skill in the art upon review of the present specification. The claims are intended to cover such modifications and devices.

We claim:

1. A method of forming a semiconductor device, comprising:

forming a gate electrode over a substrate;

measuring a dimension of the gate electrode;

carrying out dopant implanting into the substrate at a concentration based on the measured gate electrode dimension, wherein the dopant implanting forms a lightly-doped region in the substrate;

forming a spacer on the gate electrode after forming the lightly-doped region in the substrate;

carrying out a second measuring of a dimension of the gate electrode after forming the spacer; and carrying out a subsequent dopant implanting into the substrate at a concentration based on the second measured gate electrode dimension.

2. The method of claim 1, further comprising:

comparing the measured dimension of the gate electrode with a desired value, and determining a concentration for the dopant implanting taking into account any difference between the measured dimension of the gate electrode and the desired value.

3. The method of claim 1, further comprising forming a gate insulating layer over the substrate before forming the gate electrode.

4. The method of claim 1, wherein the gate electrode is made of polysilicon.

5. The method of claim 1, wherein the semiconductor device is a CMOS device and the method further comprises separate steps of forming an NMOS device and a PMOS device.

6. The method of claim 1, wherein the forming of the gate electrode comprises forming a gate electrode layer over the substrate and patterning and etching the gate electrode layer.

7. The method of claim 6, wherein the forming of the gate electrode comprises patterning and exposing a photoresist layer formed over the gate electrode layer.

8. The method of claim 1, wherein the dimension of the gate electrode layer is measured with a scanning electron microscope.

* * * * *